United States Patent [19]

Link

[11] 4,342,069

[45] Jul. 27, 1982

[54] INTEGRATED CIRCUIT PACKAGE

[75] Inventor: Joseph Link, Carrollton, Tex.

[73] Assignee: Mostek Corporation, Carrollton, Tex.

[21] Appl. No.: 234,400

[22] Filed: Feb. 13, 1981

Related U.S. Application Data

[63] Continuation of Ser. No. 53,879, Jul. 2, 1979, abandoned.

[51] Int. Cl.³ .............................................. H05K 1/14
[52] U.S. Cl. .................................. 361/401; 361/395; 361/403; 361/414
[58] Field of Search ............... 361/414, 413, 395, 403, 361/418, 401; 174/52 S, 52 FP

[56] References Cited

U.S. PATENT DOCUMENTS

| | | | |
|---|---|---|---|
| 2,725,537 | 6/1956 | Wolfe | 361/414 |
| 2,907,926 | 10/1959 | Slack | 361/395 |
| 3,447,040 | 5/1969 | Denton | 361/403 X |
| 3,634,600 | 1/1972 | Griffin | 361/414 X |
| 3,760,090 | 9/1973 | Fowler | 361/414 X |
| 3,778,754 | 12/1973 | Takashashi | 361/418 X |
| 3,874,768 | 4/1975 | Cutchaw | 339/17 CF |
| 3,904,262 | 9/1975 | Cutchaw | 339/17 CF |
| 3,941,916 | 3/1976 | Morse | 361/414 X |
| 3,958,155 | 5/1976 | Bogholtz | 361/414 |
| 4,004,196 | 1/1977 | Doucet | 361/414 |
| 4,012,117 | 3/1977 | Lazzery | 361/395 X |

OTHER PUBLICATIONS

Rasile et al., Low-Cost Stacked Module, IBM Tech. Disc. Bull., v. 22, #2, Jul. 1979, pp. 525 & 526.

Primary Examiner—Richard R. Kucia

[57] ABSTRACT

An integrated semiconductor package containing circuitry capable of supporting separately packaged semiconductors to achieve greater circuit board density and to allow separate semiconductor packages which cooperate with the supporting semiconductor package and die to be interchanged. The supporting die is interconnected electrically to lead pins and socket contacts using conductive circuitry compatible with the other semiconductor die.

In a first embodiment corresponding metallization patterns are used to electrically interconnect an integrated circuit package to a conventional printed wiring board or ceramic wiring board containing socket contacts to receive lead pins from another integrated circuit package. A second embodiment is a unitized package containing integral socket contacts within the unitized integrated package to receive lead pins from another integrated circuit package.

14 Claims, 2 Drawing Figures

INTEGRATED CIRCUIT PACKAGE

This is a continuation of application Ser. No. 53,879 filed July 2, 1979, now abandoned.

BACKGROUND OF THE INVENTION

1. Field of the Invention

This invention relates to integrated circuit packages and more particularly, but not by way of limitation, to integrated circuit packages which may support more than one integrated circuit.

2. Description of the Prior Art

Certain electronic applications or methods require functional electronic cooperation between two or more integrated circuits. For example, functional electronic cooperation is often required between an integrated circuit microprocessor die and an integrated circuit electrically programmable/ultraviolet erasable read only memory (EPROM) die. With certain electronic applications, a critical design objective is reducing the amount of area space required to conduct certain electronic functions.

One method used by the prior art to reduce the amount of required area space has been to incorporate the cooperative electronic functions of a microprocessor and an EPROM on a monolithic integrated circuit that is placed into an integrated circuit package. Using this method, the EPROM may be erased using ultraviolet light transmitted through a window in the lid of the integrated circuit package. This method has proven to be very expensive due to the low die per wafer yield resulting from manufacturing two electronic circuit functions on the same, large monolithic integrated circuit die and also because of the large, special window lid required.

One other prior art method is the simple stacking of integrated circuit packages. This method does not provide interconnects in a single package.

SUMMARY OF THE INVENTION

Advantages of the present invention include the use of two die rather than one which provides better reliability and yeild. Further, more than one type of EPROM may be used with the same microprocessor. Also, one socket set and interconnections are eliminated, thereby decreasing board area and costs. Finally, the overall field retrofit/repair capability is increased.

The present invention allows the use of separate die while still achieving the same goal of reducing space requirements. By way of example, the present invention allows for the use of separate EPROM and microprocessor die while achieving the requirement of reducing area space. With the present invention, the use of two die rather than one provides for increased die per wafer yields and improved electronic application flexibility by allowing more than one type of EPROM to be used with the same microprocessor die. The first embodiment is a two-piece integrated circuit package. The first piece contains a region in which a microprocessor die may be placed and interconnected to a metallization pattern. The second piece is comprised of a non-conductive material, such as ceramic or PC board material, having socket contacts, connected with metallization patterns which will accept the pins of a separate integrated circuit package.

A microprocessor die may be mounted in a ceramic integrated circuit package provided with means to electrically receive a second integrated circuit package. A second separate integrated circuit package containing an EPROM die assembled using techniques and skills recognized in the art can then be inserted into the socket contacts of the microprocessor package to produce electrical interconnection between the integrated circuits.

A second embodiment is a unitized integrated circuit package containing integral interconnection conductors and socket contacts. These components are dielectrically separated within the integrated package. In this embodiment a microprocessor die may be assembled and hermetically sealed into a ceramic integrated circuit package using techniques and skills recognized in the art. A separate integrated circuit package assembly containing an EPROM die may then be inserted into the integral socket contacts to produce electrical interconnection between the integrated circuits.

DESCRIPTION OF THE PREFERRED EMBODIMENT

Figure 1:
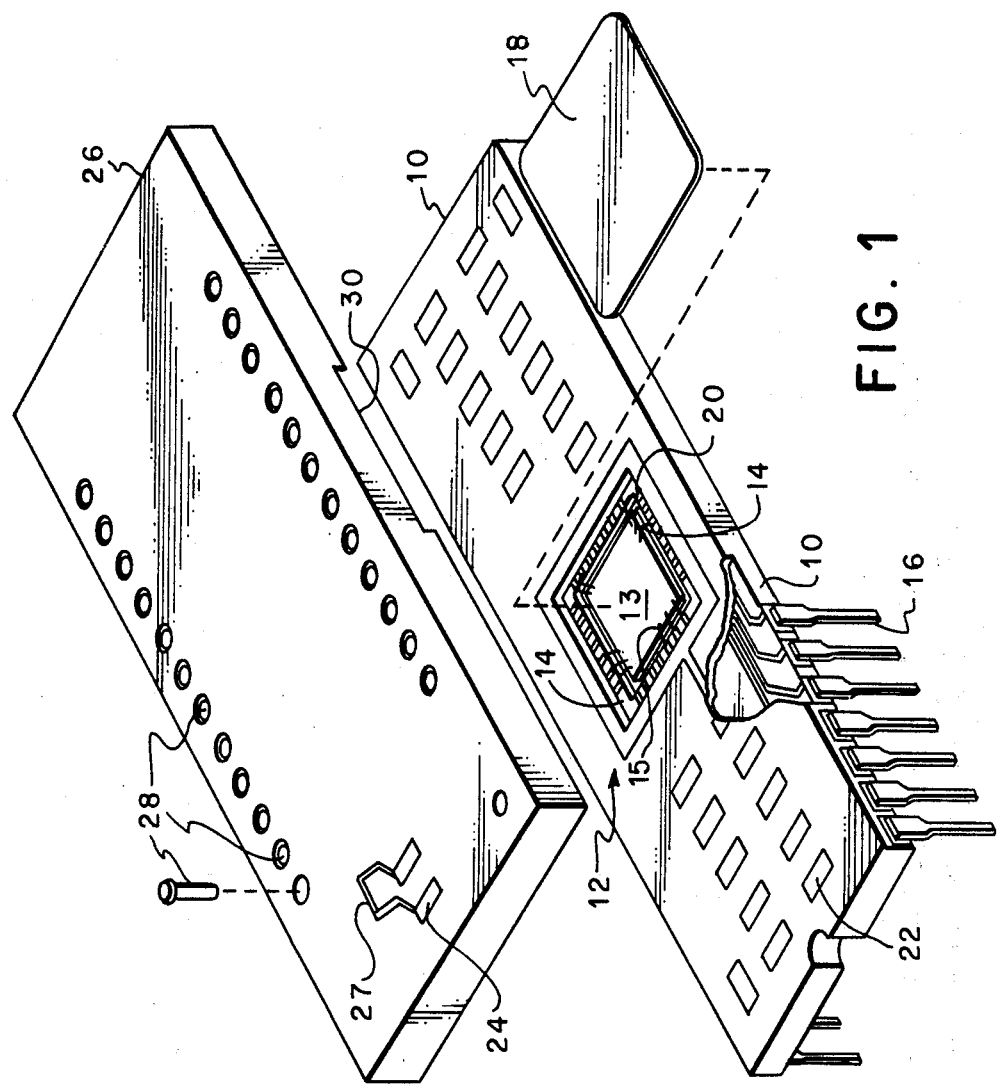
FIG. 1 shows a perspective exploded view of a two-piece integrated socket package embodying the present invention.

With reference to FIG. 1, a preferred embodiment of the invention includes an integrated circuit package 10 with a die-cavity 12. The integrated circuit package body may be ceramic or other material that is not conductive. Typically a microprocessor unit or other integrated circuit on a die 13 is placed in the die-cavity 12. Bonding finger pads 14 are shown to connect the die 13 by the interconnecting conductors 15. The bonding finger pads 14 are also interconnected with the external lead pins 16. A lid 18 is also shown ready to be attached to the package by lid seal metallization 20.

The integrated circuit package 10 is provided with a first metallization pattern 22 on its top surface. This metallization pattern may typically be composed of conductors and solder pads. A second metallization pattern 24 is provided on the bottom surface of the socket board 26 to match the first metallization pattern 22, thereby capable of interconnecting the integrated circuit package 10 and the socket board 26. The electrical interconnection between the ceramic integrated circuit package and conventional printed wiring or ceramic wiring board may be accomplished using such recognized techniques as alloy or elemental fusion reflow, conductive elastomeric or conductive particles combined with adhesive bonding substances. The body of socket board 26 is preferably nonconductive multi-layered.

As shown, there are metalized interconnects 27 from the second metallization pattern 24 to the socket contacts 28. A separate integrated circuit package, not shown, such as an EPROM on its own die, may then be plugged into these receptacles, providing a single space integrated circuit package comprised of a microprocessor and an EPROM which is interchangeable or may be removed multiple times for programming.

Note that the socket board 26 shown has a notch 30 to fit over the lid 18. The same effect can be similarly achieved by raising the first metallization pattern 22 slightly to meet the second metallization pattern 24. In this manner the socket board 26 can be a uniform board and no notch is required.

Figure 2:
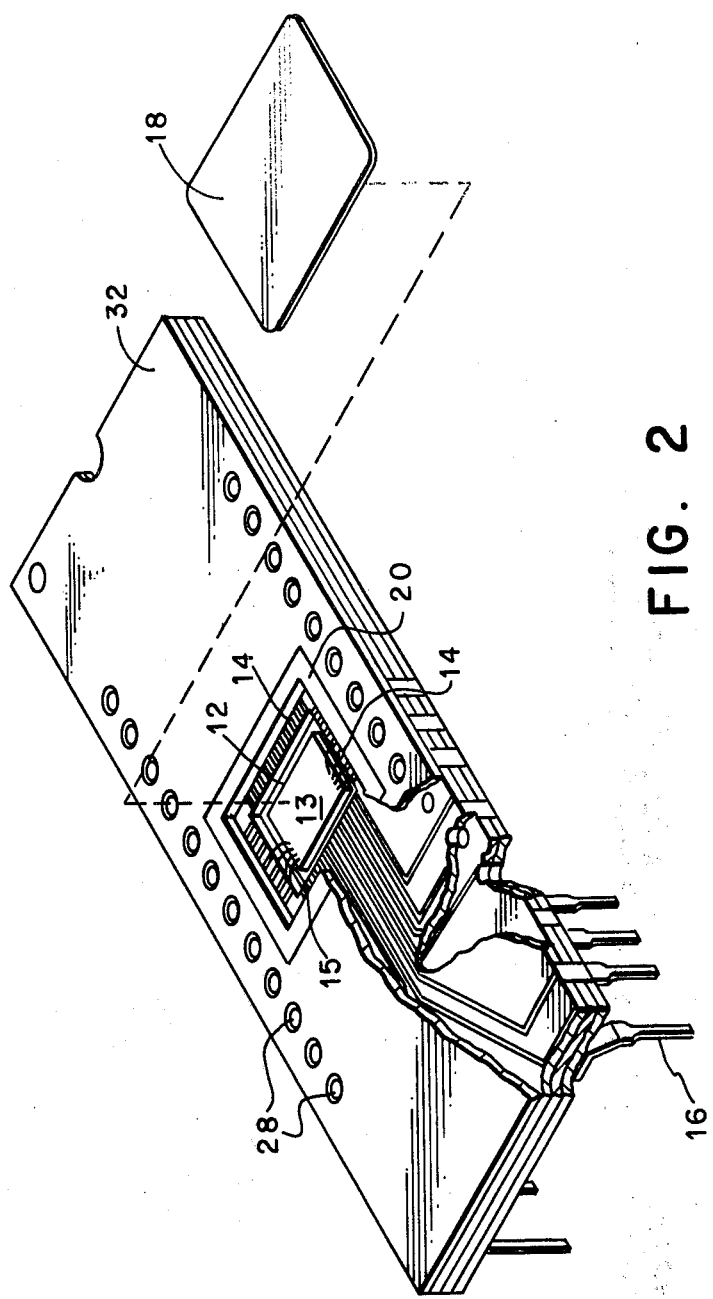
FIG. 2 is a perspective exploded view of a one-piece integrated socket package embodying the present invention.

Referring now to FIG. 2, the second embodiment of the invention is shown. A single integrated circuit package 32 is used to provide a unitized socket and integrated circuit package. A die-cavity 12 with interconnections or bonding wires 15 is shown connecting the die 13 to the bonding pads 14. The bonding pads 14 lead to external lead pins 16. The lid 18 covers the circuit package cavity. Socket contacts 28 are further spaced on the package 32 to receive a separate integrated circuit package. The socket pin contacts 28 are interconnected to the bonding pads 14.

Typically the socket contacts 28 will be spaced between the leads 16. The leads 16 may be side mounted as in FIG. 1 or may be bottom or top mounted as shown in FIG. 2. Further, when bottom mounted, leads 16 may be formed with an angular portion between the vertical contact portion and the horizontal portion attached to the package. This provides further room and spacing for the socket contacts 28.

While the invention has been shown and described with reference to certain preferred embodiments thereof, it will be understood that various changes in form and detail may be made therein without departing from the spirit and scope of the invention as defined by the appended claims.

What is claimed is:

1. A unitized integrated circuit package for actively interconnecting an integrated circuit to an active circuit comprising:
    (a) a supporting package having a top and bottom,
    (b) a die cavity in the package,
    (c) bonding finger pads for connecting an integrated circuit die,
    (d) a die cavity lid for sealing the integrated circuit die,
    (e) external lead pins extending from the package bottom in a first pattern and interconnected with the bonding finger pads, and
    (f) socket contacts spaced in the supporting package top in a second pattern and interconnected with the bonding finger pads to receive an integrated circuit package to provide a functionally active interconnection between the integrated circuit die and the integrated circuit package.

2. A single space integrated circuit package for actively interconnecting an integrated circuit to an active circuit in a vertically stacked relationship, comprising:
    an integrated circuit package body having a top and a bottom,
    an integrated circuit mounted within the body,
    a plurality of external lead pins in a first pattern having one end terminating within the body and a second end extending from the package body bottom,
    an array of interconnecting conductors within the body for connecting said integrated circuit to selected ones of said lead pins, and
    a plurality of sockets arranged in a second pattern at the top of said body for receiving the lead pins of the active circuit, said sockets connected selectively to ones of the interconnecting conductors to provide a functional interaction through said sockets between the integrated circuit and the active circuit.

3. A single space integrated circuit package as set forth in claim 2 wherein said integrated circuit is a microprocessor.

4. A single space integrated circuit package as set forth in claim 2 wherein the first pattern of said plurality of external lead pins comprises parallel rows spaced apart, and the second pattern of said plurality of sockets comprises parallel rows having the same spaced apart distance as the first pattern.

5. A single space integrated circuit package as set forth in claim 4 wherein the sockets in the second pattern are interdigitated with the external lead pin in the first pattern.

6. A single space integrated circuit package for actively interconnecting an integrated circuit to an active circuit in a vertically stacked relationship, comprising:
    an integrated circuit package having an integrated circuit die mounting means,
    an integrated circuit mounted within the die mounting means,
    a plurality of external lead pins in a first pattern having one end terminating within the integrated circuit package and a second end extending from the package,
    a first array of interconnecting conductors within said integrated circuit package for connecting said integrated circuit to selected ones of said lead pins,
    a socket board mounted to said integrated circuit package;
    a plurality of sockets arranged in a second pattern at the top of said board for receiving lead pins of the active circuit, and
    a second array of interconnecting conductors for connecting sockets in said socket board selectively to ones of the interconnecting conductors within said integrated circuit package to provide a functional interaction through said sockets between the integrated circuit and the active circuit.

7. A single space integrated circuit package as set forth in claim 6 wherein the plurality of sockets are spaced individually between adjacent lead pins.

8. A single space integrated circuit package for actively interconnecting an integrated circuit to an active circuit in a vertically stacked relationship, comprising:
    an integrated circuit package body having a top and a bottom and including a die cavity,
    an integrated circuit mounted within the die cavity of said body,
    a plurality of external lead pins in a first pattern having one end terminating within the body and a second end extending from the package body bottom,
    an array of interconnecting conductors within the body connected to selected ones of said lead pins,
    a plurality of sockets arranged in a second pattern at the top of said body for receiving the lead pins of the active circuit, said sockets connected selectively to ones of the interconnecting conductors, and
    an array of bonding pads arranged around the periphery of the die cavity for connecting individual interconnecting conductors to said integrated circuit to provide a functional interaction through said sockets between the integrated circuit and the active circuit.

9. A single space integrated circuit package as set forth in claim 8 wherein said integrated circuit is hermetically sealed within the die cavity of said body.

10. A single space integrated circuit package for interconnecting an integrated circuit to an active circuit in a vertically stacked relationship, comprising:
  a multi-layer integrated circuit package having a die cavity, bonding finger pads, and a die cavity lid,
  an integrated circuit mounted within the die cavity of said circuit package,
  a plurality of external lead pins in a first pattern having one end terminating within said circuit package and a second end extending therefrom,
  an array of interconnecting conductors within said multi-layer integrated circuit package for connecting said integrated circuit through said bonding pads to selected ones of said lead pins,
  a first metalization pattern on the top surface of said integrated circuit package,
  a socket board mounted to the integrated circuit package;
  a plurality of sockets arranged in a second pattern at the top surface of the socket board for receiving the lead pins of the active circuit, and
  a second metalization pattern on the bottom surface of the socket board to match the first metalization pattern to interconnect said sockets individually to ones of the interconnecting conductors to provide a functional interaction through said sockets between the integrated circuit and the active circuit.

11. A single space integrated circuit package as set forth in claim 10 wherein the body of the socket board is multi-layered and constructed of a nonconductive material.

12. A single space integrated circuit package as set forth in claim 10 wherein the external lead pins are formed from a vertical contact portion, a bottom mounted horizontal portion, and a bent portion between the vertical contact portion and the horizontal portion to increase spacing provided between the socket contacts and the lead pins.

13. A single space integrated circuit package for interconnecting a first integrated circuit to a second integrated circuit in a vertical stacked relationship, comprising:
  a supporting package,
  a die cavity in said package,
  a first integrated circuit mounted within the die cavity of the supporting package,
  bonding finger pads spaced about the die cavity for connecting to the first integrated circuit,
  a die cavity lid for sealing the first integrated circuit into the die cavity,
  a plurality of external lead pins in a first pattern having one end interconnected with selected ones of the bonding finger pads and a second end extending from said supporting package, and
  a plurality of sockets arranged in a second pattern at the top surface of the supporting package for receiving the lead pins of the second integrated circuit, said sockets interconnected with the bonding finger pads to provide a functional interaction between the first integrated circuit package and the second integrated circuit package.

14. A single space integrated circuit package for interconnecting a first integrated circuit to a second integrated circuit in a vertically stacked relationship, comprising:
  an elongate lower body having a die cavity opening,
  a plurality of downward extending lead pins in a first pattern connected to said lower body,
  a plurality of bonding pads mounted on said lower body along the periphery of said opening,
  a first integrated circuit mounted within the opening and connected to the bonding pads by interconnecting conductors,
  a first pattern of metal pads bonded to a surface of said lower body opposite the surface of the downwardly extending lead pins,
  a first set of interconnecting conductors connecting said bonding pads to the metal pads in said first pattern,
  an elongate upper body having a plurality of sockets arranged in a second pattern and extending through the surface of the upper body for receiving the lead pins of the second integrated circuit,
  a second pattern of metal pads on the surface of said upper body opposite the surface thereof having said sockets extending therethrough, said second pattern corresponding to said first pattern,
  a second set of interconnecting conductors connecting said sockets to said metal pads on the upper body, and
  means for joining said upper body to said lower body wherein the corresponding metal pads in the first and second patterns are placed in contact for establishing interconnection between the bonding pads, said lead pins, and said sockets.

* * * * *